(12) United States Patent
Chen et al.

(10) Patent No.: US 12,169,213 B2
(45) Date of Patent: Dec. 17, 2024

(54) POWER MEASUREMENT METHODS AND SYSTEMS FOR HOT PLUGGABLE SOLID-STATE DRIVES IN SERVERS

(71) Applicant: SK hynix Inc., Icheon-si (KR)

(72) Inventors: Xiaofang Chen, Milpitas, CA (US); Wenwei Wang, Morgan Hill, CA (US)

(73) Assignee: SK HYNIX INC., Icheon-si (KR)

( * ) Notice: Subject to any disclaimer, the term of this patent is extended or adjusted under 35 U.S.C. 154(b) by 37 days.

(21) Appl. No.: 17/985,443

(22) Filed: Nov. 11, 2022

(65) Prior Publication Data

US 2024/0159806 A1 May 16, 2024

(51) Int. Cl.
*G01R 27/28* (2006.01)
*G01R 21/06* (2006.01)
*G06F 3/06* (2006.01)
*H04B 1/38* (2015.01)

(52) U.S. Cl.
CPC ........... *G01R 21/06* (2013.01); *G06F 3/0616* (2013.01); *G06F 3/0653* (2013.01); *G06F 3/0679* (2013.01); *H04B 1/38* (2013.01)

(58) Field of Classification Search
CPC . G02F 1/1309; G02F 1/133308; G09G 3/006; G09G 3/36; G03B 21/006
See application file for complete search history.

(56) References Cited

U.S. PATENT DOCUMENTS

| | | | |
|---|---|---|---|
| 8,396,686 B2 | 3/2013 | Song et al. | |
| 10,146,293 B2 | 12/2018 | Khatib et al. | |
| 10,578,658 B2 * | 3/2020 | Dunn | H04L 67/51 |
| 11,809,727 B1 * | 11/2023 | Tuzzolino | G11C 16/08 |
| 2002/0062454 A1 * | 5/2002 | Fung | G06F 3/0689 713/300 |
| 2006/0264178 A1 * | 11/2006 | Noble | H04K 3/46 455/67.11 |
| 2011/0072293 A1 * | 3/2011 | Mazzaferri | G06F 1/3203 713/340 |
| 2020/0150733 A1 * | 5/2020 | Gutierrez | G06F 1/28 |

* cited by examiner

*Primary Examiner* — Thang X Le
(74) *Attorney, Agent, or Firm* — Perkins Coie LLP

(57) ABSTRACT

Devices, systems, and methods for measuring a power consumption of a hot pluggable solid-state drives are described. An example method for measuring a power consumption of a solid-state drive communicatively coupled to a server backplane within a server chassis includes performing, by an adaptor, a power measurement to generate a value corresponding to the power consumption of the solid-state drive, and transmitting, using a wireless transceiver of the adaptor, the value to a recording unit, where a first end of the adaptor is coupled to the solid-state drive and a second end of the adaptor is coupled to the server backplane, and where the wireless transceiver, communicatively coupled to an antenna, is configured to operate using at least one wireless protocol.

20 Claims, 7 Drawing Sheets

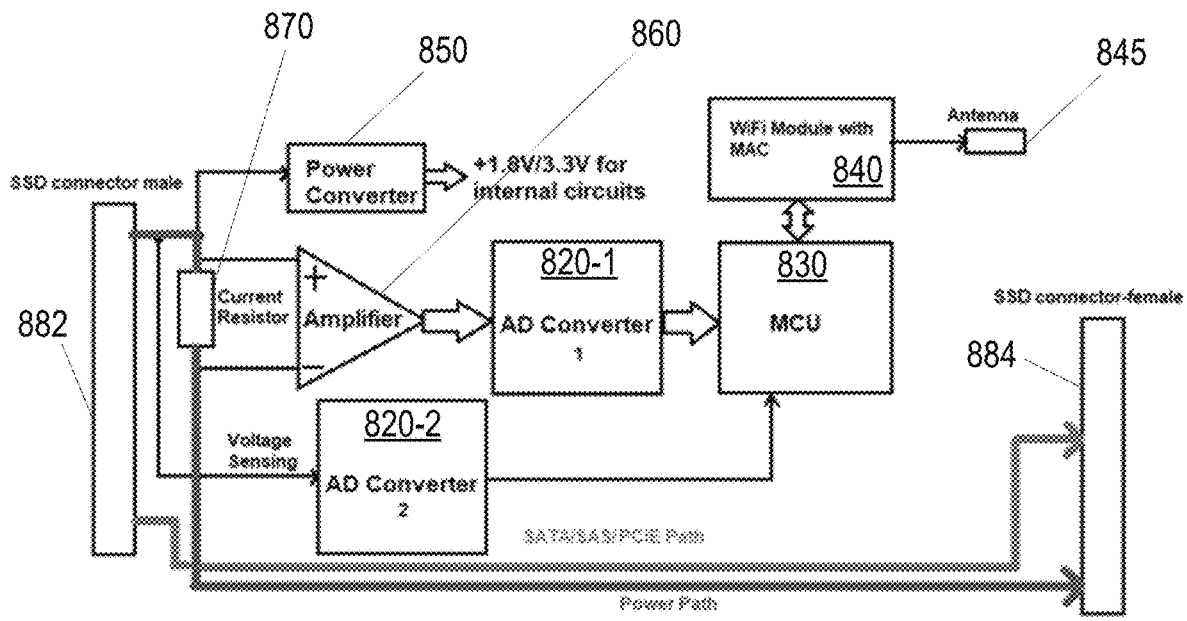
FIG. 8
Amended

POWER MEASUREMENT METHODS AND SYSTEMS FOR HOT PLUGGABLE SOLID-STATE DRIVES IN SERVERS

TECHNICAL FIELD

This patent document generally relates to storage systems, and more specifically, to hot pluggable solid-state drives in server storage systems.

BACKGROUND

A solid-state drive (SSD) is a solid-state storage device that uses integrated circuit assemblies to store data persistently, typically using flash memory, and functioning as secondary storage in the hierarchy of computer storage. Compared with electromechanical drives, SSDs are typically more resistant to physical shock, run silently, and have higher input/output operations per second (IOPS) and lower latency. SSDs store data in semiconductor cells, which can contain between 1 and 4 bits of data. High performance flash-based SSDs generally require half to a third of the power of hard disk drives.

SUMMARY

Embodiments of the disclosed technology relate to methods, systems, and devices that measure the power consumption of hot pluggable solid-state drives (SSDs) in servers (or Redundant Array of Independent Disks (RAID) implementations). In an example, this is achieved by using an adaptor, which measures the power consumption of SSDs as close to real deployment conditions as possible. The described embodiments advantageously eliminate the use of oscilloscopes and other laboratory equipment typically used to measure the power consumption of SSDs.

In one example, method for measuring a power consumption of a solid-state drive communicatively coupled to a server backplane within a server chassis is described. The method includes performing, by an adaptor, a power measurement to generate a value corresponding to the power consumption of the solid-state drive, and transmitting, using a wireless transceiver of the adaptor, the value to a recording unit, where a first end of the adaptor is coupled to the solid-state drive and a second end of the adaptor is coupled to the server backplane, and where the wireless transceiver, communicatively coupled to an antenna, is configured to operate using at least one wireless protocol.

In another example, a device for measuring a power consumption of a solid-state drive communicatively coupled to a server backplane within a server chassis is described. The device includes an adaptor comprising a first end coupled to the solid-state drive that is communicatively coupled to a server backplane within a server chassis, a second end coupled to the server backplane, a power sensing circuit configured to perform a power measurement to generate a value corresponding to the power consumption of the solid-state drive, and a wireless transceiver configured to operate using at least one wireless protocol and transmit the value to a recording unit.

In yet another example, the methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 8 is an example schematic of the Wi-Fi™-based adaptor.

DETAILED DESCRIPTION

Figure 1:
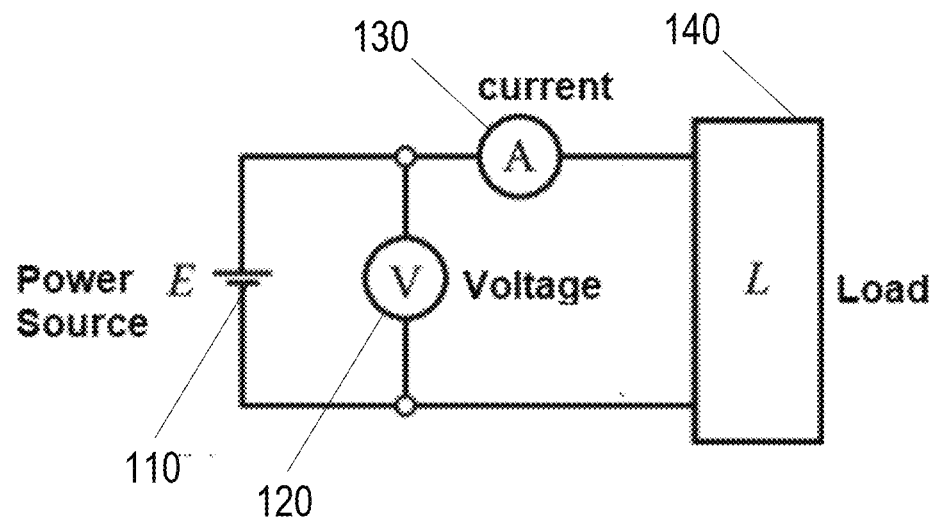
FIG. 1 illustrates an example schematic used for power measurements.
Figure 2:
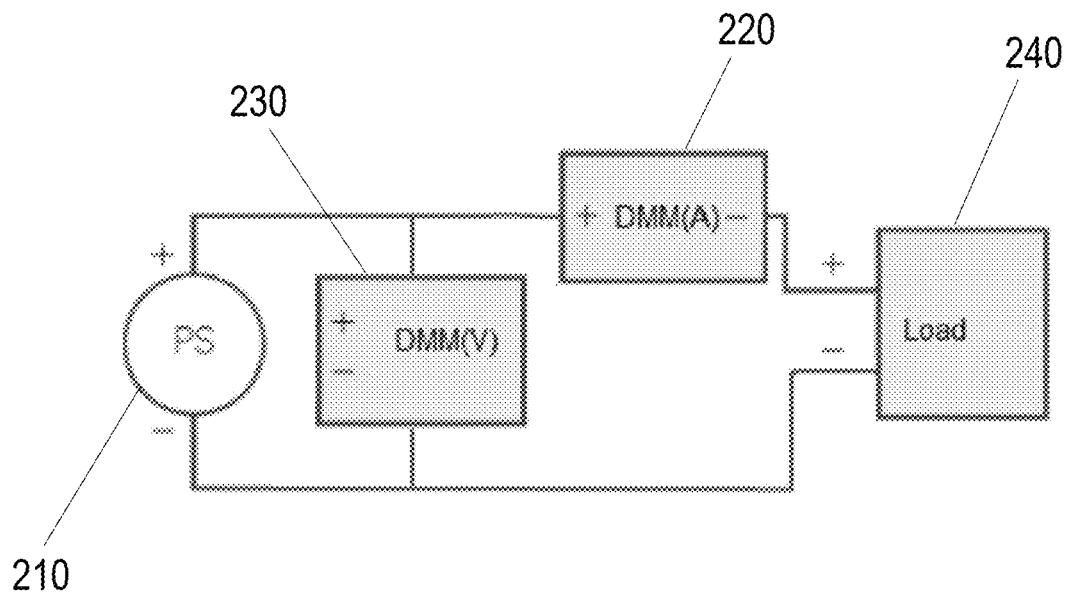
FIG. 2 illustrates an example schematic used for power measurements with multiple instances of a digital multimeter (DMM).

Electronics are usually powered by a fixed power supply, and knowing how much power a circuit consumes to be able to maximize the operational lifetime of the circuit. FIG. 1 illustrates an example schematic used for power measurements. As shown therein, a power source 110 is connected to a load 140 via a circuit that includes a voltmeter 120 and an ammeter 130. The voltmeter 120 measures the voltage across the load and the ammeter measures the current flowing into the load. Based on these measurements (V for voltage and A for current), the power can be computed as $P = V \times A$. In some configurations, the voltmeter and ammeter can each be replaced by a digital multimeter (DMM), which is configured to measure and verify multiple electrical stimuli, including voltage, current, and resistance. In other configurations, and as illustrated in FIG. 2, the power measurement can also be performed using an oscilloscope with a current probe and a voltage probe. In an example, the current measurement may be obtained using a precision low-value resistor or a non-invasive O-Ring type of current sensor. In another example, the voltage measurement can be obtained using an analog-to-digital converter (ADC).

In the described configurations, the load (140 and 240) shown in FIGS. 1 and 2, respectively, is a solid-state drive (SSD) in a server system (or Redundant Array of Independent Disks (RAID) implementation), and the power source (110 and 210, respectively) is either a nominal +5V DC or +12V DC power source.

The ability to accurately measure the power consumption of SSDs is critical to SSD manufacturers. The SSDs are typically tested in various server platforms and different vendor configurations to obtain idle, average, and/or peak power measurement values. Ideally, these measurements are made in realistic server operation environments. Data center servers have clusters of SSDs plugged into a chassis backplane for data storage, computing, and transfer. The SSDs are either inserted vertically (as shown in FIG. 3A) or horizontally (as shown in FIG. 3B) into the chassis, and is typically placed in a tray (as shown in FIG. 4) prior to its insertion.

Figure 3A:
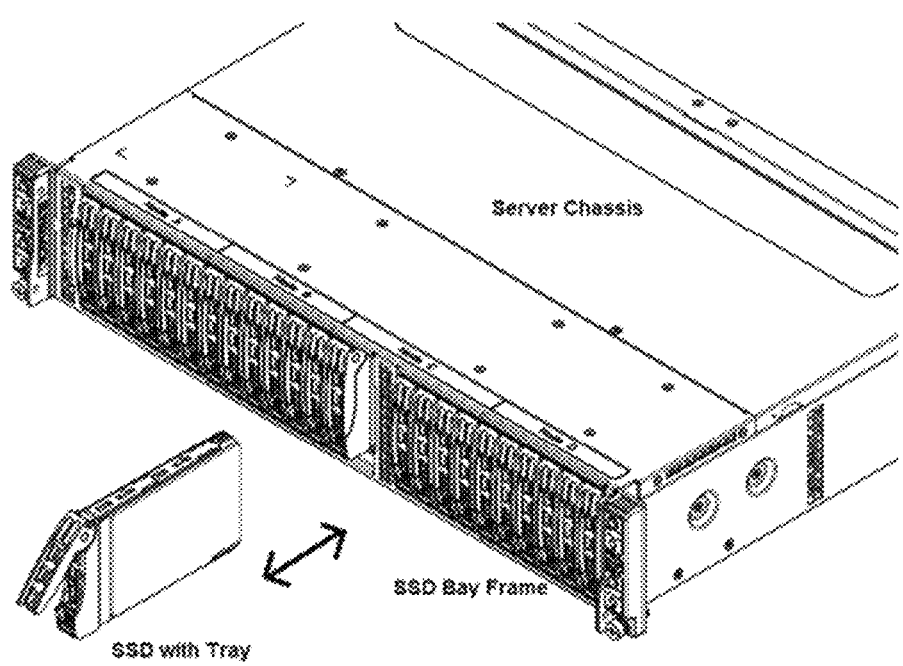
FIG. 3A is an example diagram illustrating the vertical insertion of an SSD.
Figure 3B:
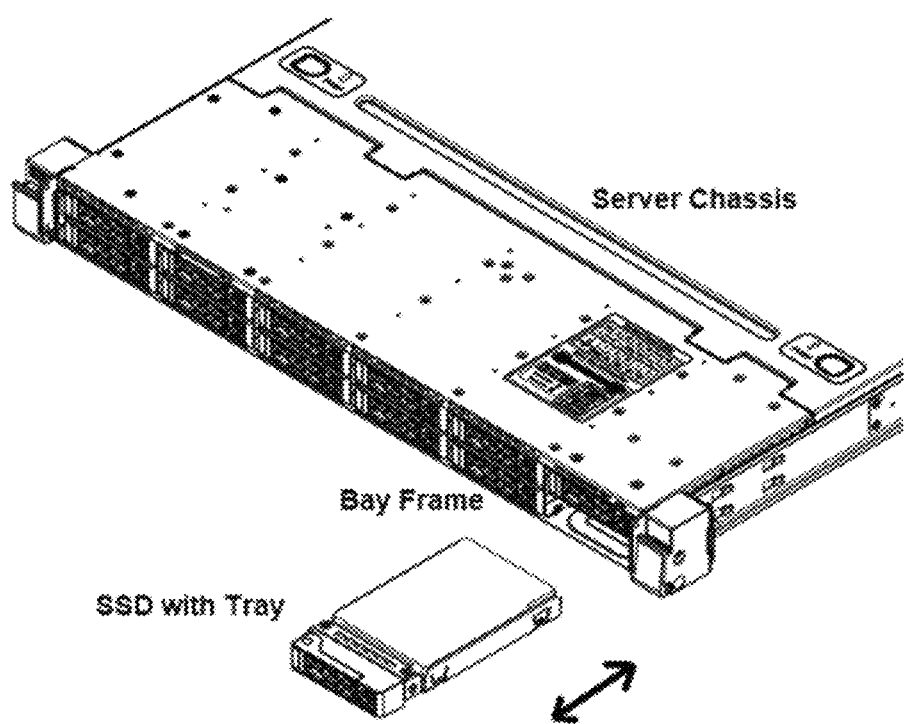
FIG. 3B is an example diagram illustrating the horizontal insertion of an SSD.
Figure 4:
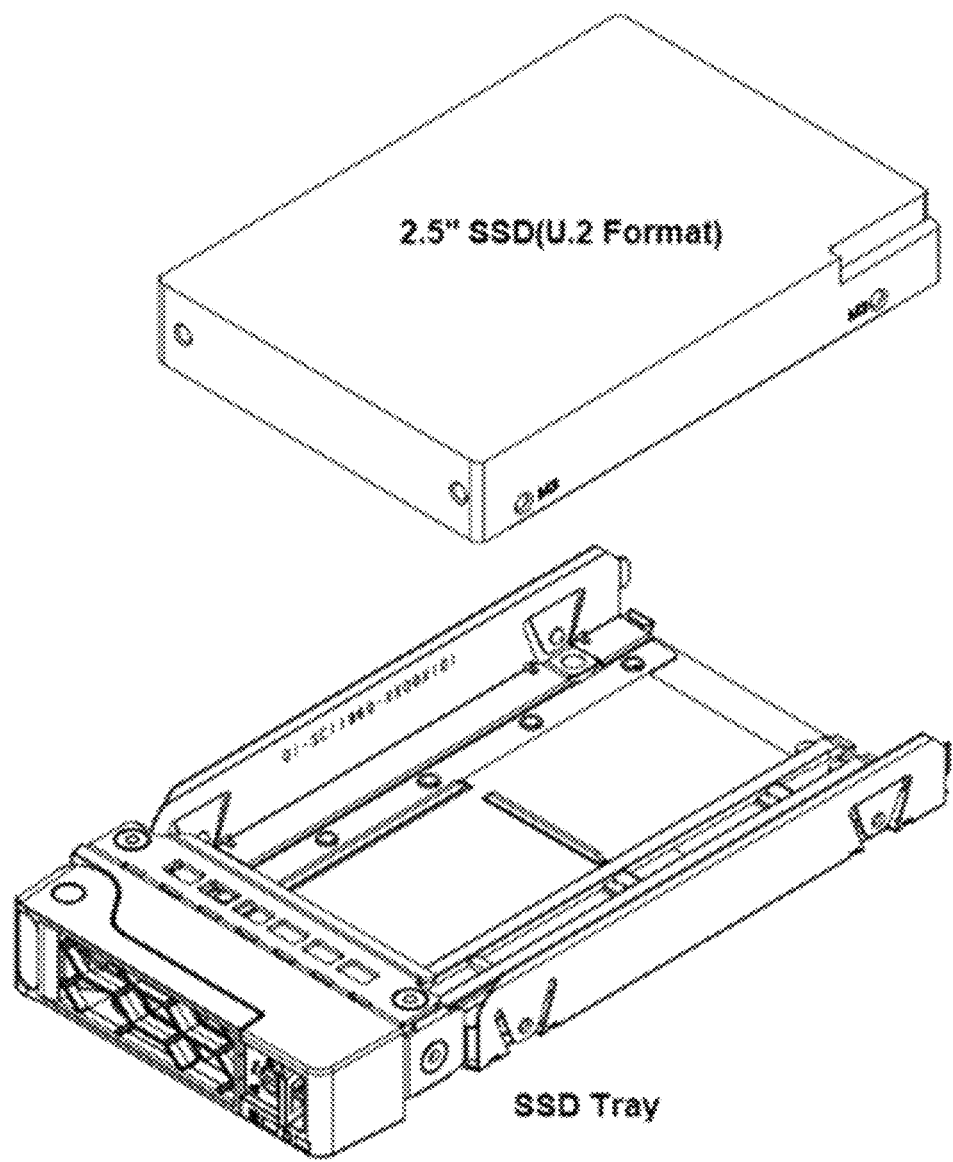
FIG. 4 is an example diagram illustrating an SSD and a tray that is typically used to make the SSD hot pluggable.

As seen in FIGS. 3A, 3B and 4, there is very limited extra or additional space that is available after the SSD has been inserted into the server chassis, which precludes the use of a DMM or scope hookup to measure the power. Thus, existing measurement methods for power consumption are not able to measure SSD power consumption (e.g., peak, idle, and average power values) when the server is in full operation with all SSDs inserted. SSD manufacturers and vendors are therefore constrained in the acquisition of power consumption measurement in full server (e.g., real-world) configurations and deployments.

Figure 5:
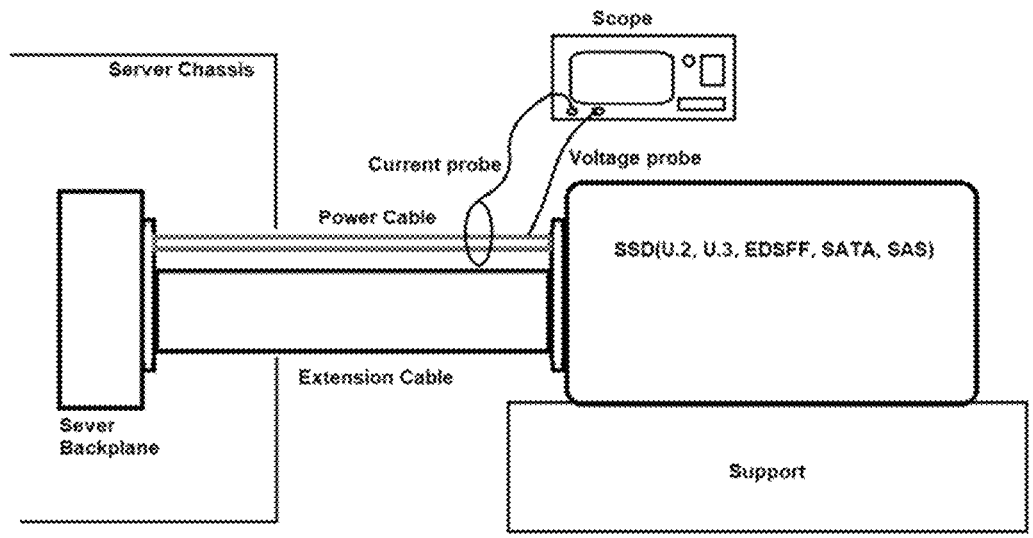
FIG. 5 is an example diagram illustrating an implementation for measuring power consumption using an extension cable.

FIG. 5 illustrates an example of an implementation for measuring power of an SSD in a server using an extension cable. As shown therein, the SSD is placed outside the server chassis and connected to the server backplane using the extension cable, which includes a separate power cable and a separate signal cable. The power cable can be coupled to a current probe and a voltage probe, connected to an oscilloscope, used to measure SSD power. Power measurement tests may be performed manually using the oscilloscope or remotely using a General-Purpose Interface Bus (GPIB), a Universal Serial Bus (USB), or an Ethernet interface on the oscilloscope. However, this method suffers from the following drawbacks:

The air flow around the SSD is different from air flow conditions when the SSD is fully plugged into the server. As a result, the SSD will operate at a different temperate and consume an amount of power that is different than what would be consumed if it were directly plugged into the server backplane;

The quality of the extension cable may affect performance of the SSD. For example, unstable link speed issues may arise when connected to newer and emerging high-speed high-performance serial computer expansion bus standards, e.g., PCIe 4.0, PCIe 5.0 and/or future PCIe x.0; and The length and quality of the extension cable may add an insertion loss, which causes the SSD to apply advanced amplification and equalization circuits to compensate for the loss, thereby increasing the power consumption.

Figure 6:
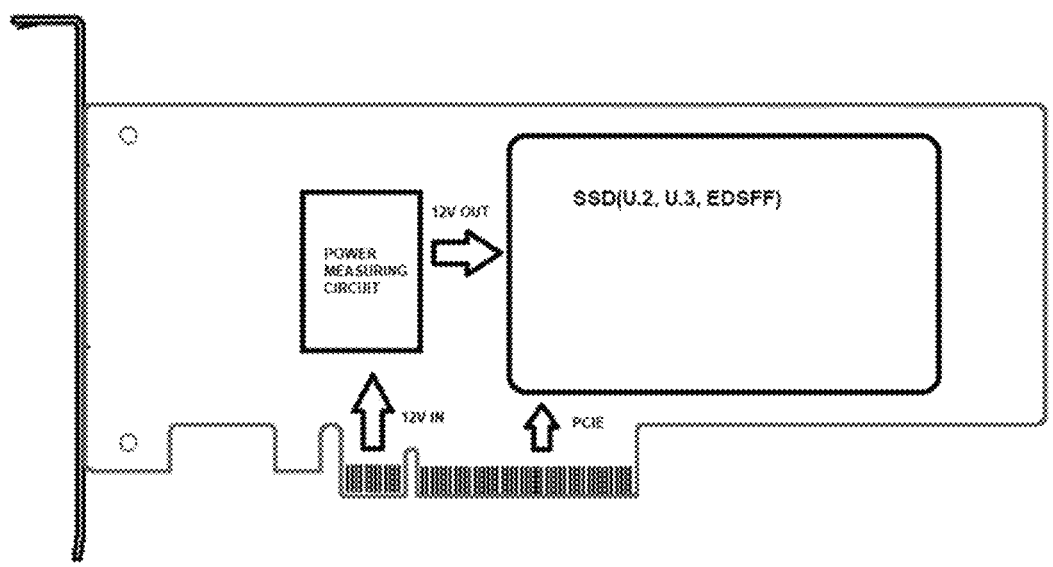
FIG. 6 is an example diagram illustrating an implementation for measuring power consumption using a benchtop adaptor.

FIG. 6 illustrates another example of an implementation for measuring power of an SSD. In this example, as shown in FIG. 6, the SSD is no longer plugged into the server, and instead, plugged into a PCIe add-in card (AIC), which is then installed in a standard PCIe slot on a benchtop or a desktop computer. The computer is configured to run the same test software as the one used by the servers for power measurements. This method leverages the special power measurement circuit that is integrated into the AIC, which can be implemented using a current loop wire for an oscilloscope, a low-value precision power resistor for the DMM/scope, and/or dedicated operational amplifier (OP-AMP)/ADC circuits. However, this method suffers from the following drawbacks:

The air flow around the SSD is different from air flow conditions when the SSD is fully plugged into the server. The power consumption measurement values may be affected unless additional air flow is calibrated and applied;

The benchtop host computer will typically use different CPUs and memory modules as compared to the server, which will result in power consumption differences;

The benchtop host computer is limited to PCIe when using the AIC, so only certain types of SSDs can be tested, e.g., U.2/U.3/EDSFF type of NVMe SSD, whereas other types cannot be tested, e.g., SATA and SAS; and The server typically uses a signal multiplexer or switch to connect to multiple SSDs, whereas the benchtop host computer uses a point-to-point connection from the CPU to the SSD. The different will also likely result in power consumption differences.

Figure 7:
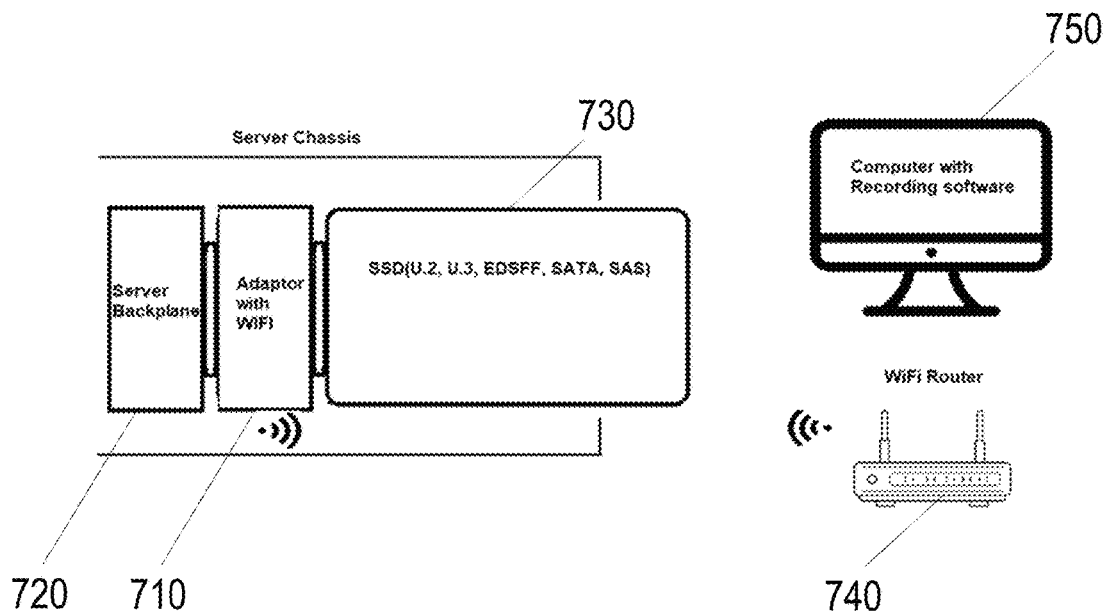
FIG. 7 is an example diagram illustrating an implementation for measuring power consumption using a Wi-Fi™-based adaptor.

Embodiments of the disclosed technology overcome previous drawbacks by using an adaptor capable of wireless communication to bridge the gap between the SSD and the server backplane, as shown in, for example, FIG. 7. Using the adaptor 710 advantageously enables the SSD 730 to be inserted with minimal signal loss into the server backplane 710 and substantially maintain the same air flow conditions as in operating conditions, and its wireless capabilities may be used to change the configuration of the adaptor and transmit power measurements to an external recording device 750 via an external communication device, e.g., a Wi-Fi™ router. Thus, the real operating conditions of the SSD with respect to server test software, link speed, air flow conditions, and the number of drives, will remain the same as power consumption is measured.

FIG. 8 is an example schematic of the Wi-Fi™-based adaptor, which is a device placed in between the solid-state drive and the server backplane, that can be configured to make power measurements and wireless transmit them to an external recording device. As shown therein, the adaptor includes at least the following components:

SSD male connector (882), which connects the adaptor to the server backplane, and is the same type of connector as on the SSD;

SSD female connected (884), which connected the adaptor to the SSD, and is the same type of connector as on the server backplane;

current sensing resistor (870) that has a low resistance and can handle high levels of current; for example, the current sensing resistor 870 may have a precision of 0.001 ohm and be rated for 5A or more, and the OP-AMP circuit (860), which convert the SSD current into voltage;

first analog-to-digital converter (ADC) (820-1), which samples and digitizes the voltage from the output of the OP-AMP circuit (860);

second ADC (820-2) that samples and digitizes the SSD input voltage values;

microcontroller unit (MCU) (830), which uses an SPI interface to read the output of both the first and second ADCs, and transmits them via the Wi-Fi™ module (840) and antenna (845) to an external recording apparatus (e.g., computer with recording software 750 in FIG. 7); and power converter (850), which provides the necessary power rails.

In some embodiments, an off-the-shelf Wi-Fi™ module (840) and antenna (845) can be used in the implementation described above.

In some embodiments, the adaptor shown in FIG. 8 can be configured to use a single ADC, which then requires additional switching and conditioning circuits. It is noted that the bandwidth and resolution of the ADC are critical parameters for operation of the adaptor.

In some embodiments, the selection and stability of the current resistor (870) is critical and, in an example, is determined using simulation models and numerical results.

In some embodiments, a wide layout and large copper shape for the power portion is implemented in the example shown in FIG. 8.

In some embodiments, the isolation of the analog, digital, power, and radio frequency (RF) portions is critical to the operation of the adaptor. The described embodiments are designed with sufficient isolation to obtain accurate measurement results without affecting the data link from the server backplane to the SSD.

In some embodiments, the length of the data link path (e.g., the SATA/SAS/PCIE Path shown in FIG. 8) is minimized to minimize signal loss.

In some embodiments, the design of the antenna of the adaptor (e.g., 845 in FIG. 8) can be configured based on the server chassis design. For example, if the server chassis has enough openings on the server backplane and SSD bay area, and if the Wi-Fi™ signal strength is greater than a threshold, then the adaptor may use an onboard printed circuit board (PCB) etch antenna or a miniature chip antenna.

Figure 9A:
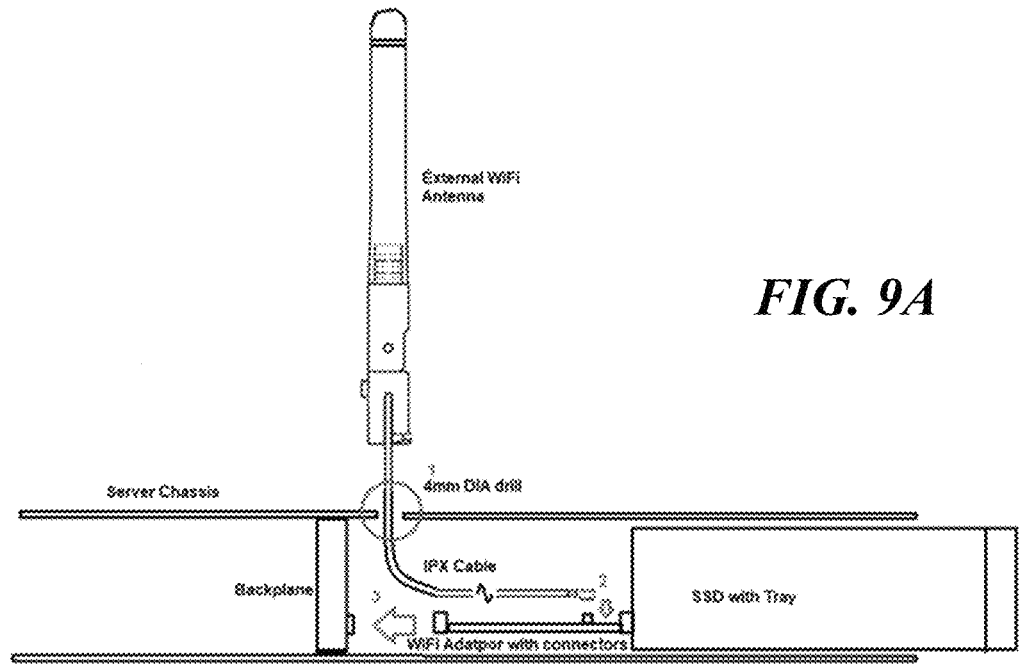
FIG. 9A is an example diagram illustrating the use of an external Wi-Fi™ antenna with a horizontal SSD bay.
Figure 9B:
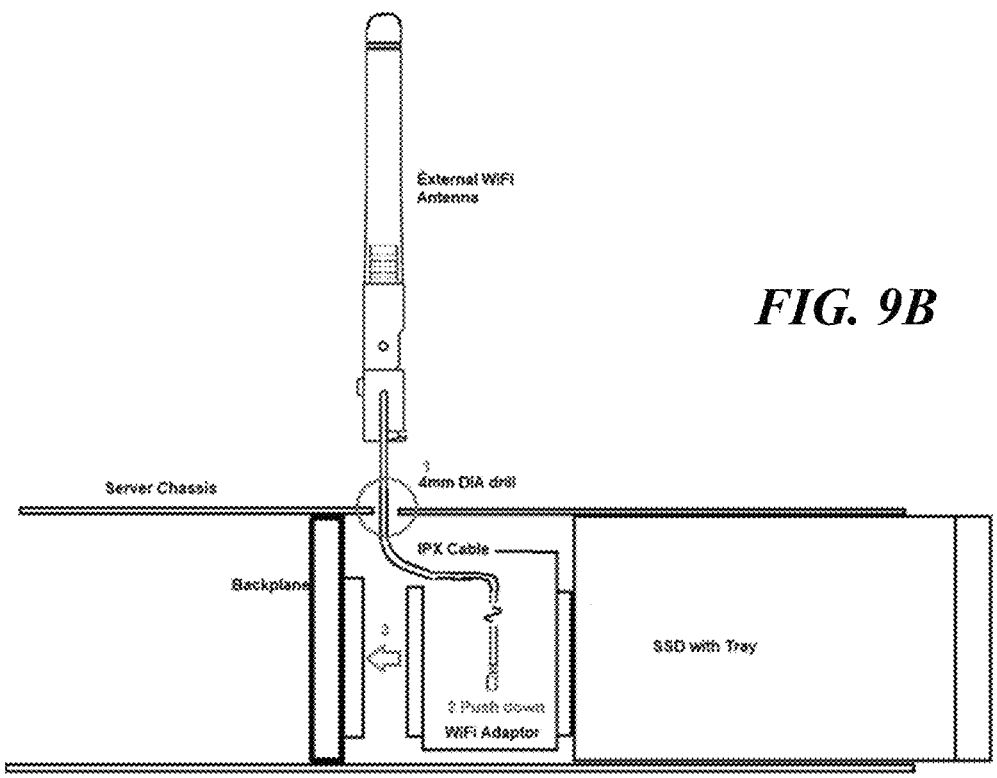
FIG. 9B is an example diagram illustrating the use of an external Wi-Fi™ antenna with a vertical SSD bay.

Alternatively, if the server chassis does not have enough openings on the server backplane and SSD bay area, and if the Wi-Fi™ signal strength is less than a threshold, then the adaptor is configured to connect to an external antenna via a cable (e.g., a miniature IPX RF cable) and drilling the server chassis is required. FIGS. 9A and 9B show examples of installing the external Wi-Fi™ antenna when the SSD is placed in a horizontal bay and a vertical bay, respectively. In the context of FIGS. 9A and 9B, an example installation process includes (1) inserting the IPX cable into the server chassis via a drilled hole (e.g., a 4 mm-diameter hole), (2) pushing the IPX connector into the IPX socket on the adaptor with the SSD attached, and (3) plugging in the adaptor and SSD together into the server backplane SSD socket.

At the cost of slightly higher power consumption and development of firmware for the MCU, the described embodiments provide, inter alia, the following advantages and benefits:

- Performing power measurements that will generate values closest to realistic fully inserted operating conditions with regard to server test software, link speed, air flow conditions, and number of drives;
- Eliminating DMMs and oscilloscopes will result in significant cost savings, especially when the need to measure multiple (up to 24) SSDs in a single server arises;
- Enabling the concurrent recording of multiple SDD power measurements (up to the limits and capabilities of the corresponding router);
- Eliminating the multiple scopes that are required in conventional methods;
- Starting and stopping the recording, and changing the ADC settings on the adaptor, remotely via the Wi-Fi™ module; and
- Using an Ethernet cable connection (not shown in FIG. 7) to start/stop the recording, and changing the SSD test software to measure idle, average, and peak power under different specified conditions.

Embodiments of the disclosed include a device for measuring the power consumption of a solid-state drive communicatively coupled to a server backplane within a server chassis. The device includes an adaptor comprising a first end coupled to the solid-state drive that is communicatively coupled to a server backplane within a server chassis, a second end coupled to the server backplane, a power sensing circuit configured to perform a power measurement to generate a value corresponding to the power consumption of the solid-state drive, and a wireless transceiver configured to operate using at least one wireless protocol and transmit the value to a recording unit.

In some embodiments, the first end is physically connected to the solid-state drive and the second end is physically connected to the server backplane.

In some embodiments, the device further comprises an antenna.

In some embodiments, the antenna is onboard the adaptor. In an example, the antenna is a printed circuit board (PCB) etch antenna or a miniature chip antenna.

In some embodiments, the antenna is located outside the server chassis and is connected to the adaptor via a cable.

In some embodiments, the adaptor further comprises at least one analog-to-digital converter (ADC) configured to operate using a first bit-width and a first dynamic range.

In some embodiments, the power measurement comprises at least one of a peak power measurement, an idle-mode power measurement, or an average power measurement.

Figure 10:
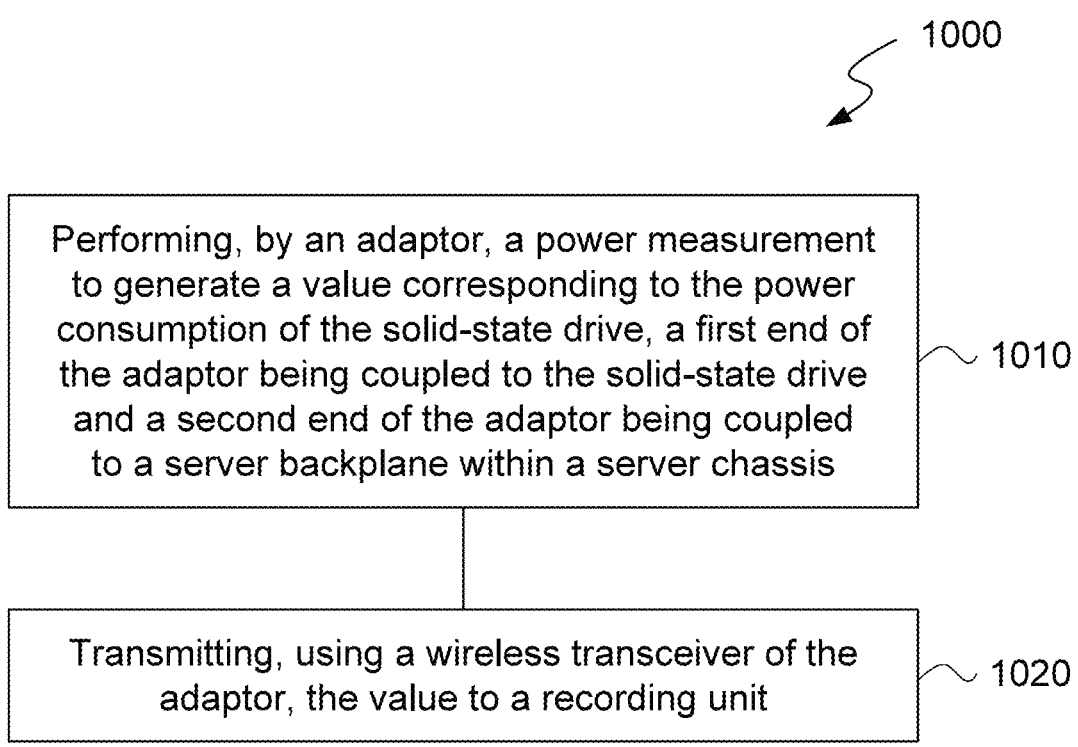
FIG. 10 illustrates a flowchart of an example method for measuring the power consumption of a solid-state drive coupled to a server backplane within a server chassis.

FIG. 10 illustrates a flowchart of an example method 1300 for measuring a power consumption of a solid-state drive communicatively coupled to a server backplane within a server chassis. The method 1000 includes, at operation 1010, performing, by an adaptor, a power measurement to generate a value corresponding to the power consumption of the solid-state drive, a first end of the adaptor being coupled to the solid-state drive and a second end of the adaptor being coupled to the server backplane.

The method 1000 includes, at operation 1020, transmitting, using a wireless transceiver of the adaptor, the value to a recording unit.

In some embodiments, the wireless transceiver, communicatively coupled to an antenna, is configured to operate using at least one wireless protocol.

In some embodiments, the adaptor being coupled to the solid-state drive excludes a use of an extension cable to perform the power measurement.

In some embodiments, the wireless transceiver is coupled to an antenna that is located within the server chassis. In an example, the antenna is an onboard printed circuit board (PCB) etch antenna or a miniature chip antenna.

In some embodiments, the wireless transceiver is coupled to an antenna that is located outside the server chassis and is connected to the adaptor via a cable.

In some embodiments, the adaptor comprises at least one analog-to-digital converter (ADC) configured to operate using a first bit-width and a first dynamic range.

In some embodiments, the method 1000 further includes the operation of receiving, using the wireless transceiver, a second bit-width different from the first bit-width or a second dynamic range different from the first dynamic range, and reconfiguring the at least one ADC to operate with the second bit-width or the second dynamic range.

In some embodiments, the power measurement comprises at least one of a peak power measurement, an idle-mode power measurement, or an average power measurement.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A device for measuring a power consumption of a solid-state drive, comprising:
    an adaptor comprising:
        a first end coupled to the solid-state drive that is communicatively coupled to a server backplane within a server chassis;
        a second end coupled to the server backplane;
        a power sensing circuit configured to perform a power measurement to generate a value corresponding to the power consumption of the solid-state drive;
        at least one analog-to-digital converter (ADC) configured to operate using a first bit-width and a first dynamic range, and sample the value to generate a digital value; and
        a wireless transceiver configured to operate using at least one wireless protocol and transmit the digital value to a recording unit.

2. The device of claim 1, wherein the first end is physically connected to the solid-state drive and the second end is physically connected to the server backplane.

3. The device of claim 1, further comprising an antenna.

4. The device of claim 3, wherein the antenna is onboard the adaptor.

5. The device of claim 4, wherein the antenna is a printed circuit board (PCB) etch antenna or a miniature chip antenna.

6. The device of claim 3, wherein the antenna is located outside the server chassis and is connected to the adaptor via a cable.

7. The device of claim 1, wherein the power measurement comprises at least one of a peak power measurement, an idle-mode power measurement, or an average power measurement.

8. The device of claim 1, wherein the power sensing circuit comprises:
    a current sensing resistor configured to generate a current measurement corresponding to the power consumption of the solid-state drive; and
    an operational amplifier configured to convert the current measurement into a voltage measurement that corresponds to the value sampled by the at least one ADC.

9. The device of claim 8, wherein the current sensing resistor is selected based on one or more simulation models and numerical results.

10. A method of measuring a power consumption of a solid-state drive communicatively coupled to a server backplane within a server chassis, the method comprising:
performing, by an adaptor, a power measurement to generate a value corresponding to the power consumption of the solid-state drive;
sampling, using at least one analog-to-digital converter (ADC) of the adaptor, the value to generate a digital value; and
transmitting, using a wireless transceiver of the adaptor, the digital value to a recording unit,
wherein a first end of the adaptor is coupled to the solid-state drive and a second end of the adaptor is coupled to the server backplane,
wherein the at least one ADC is configured to operate using a first bit-width and a first dynamic range, and
wherein the wireless transceiver, communicatively coupled to an antenna, is configured to operate using at least one wireless protocol.

11. The method of claim 10, wherein the first end of the adaptor is physically connected to the solid-state drive and the second end of the adaptor is physically connected to the server backplane.

12. The method of claim 10, wherein the adaptor being coupled to the solid-state drive excludes a use of an extension cable to perform the power measurement.

13. The method of claim 10, wherein the wireless transceiver is coupled to an antenna that is located within the server chassis.

14. The method of claim 13, wherein the antenna is an onboard printed circuit board (PCB) etch antenna or a miniature chip antenna.

15. The method of claim 10, wherein the wireless transceiver is coupled to an antenna that is located outside the server chassis and is connected to the adaptor via a cable.

16. The method of claim 10, further comprising:
receiving, using the wireless transceiver, a second bit-width different from the first bit-width or a second dynamic range different from the first dynamic range; and
reconfiguring the at least one ADC to operate with the second bit-width or the second dynamic range.

17. The method of claim 10, wherein the power measurement comprises at least one of a peak power measurement, an idle-mode power measurement, or an average power measurement.

18. A non-transitory computer-readable storage medium having instructions stored thereupon for measuring a power consumption of a solid-state drive communicatively coupled to a server backplane within a server chassis, the computer-readable storage medium comprising:
instructions for performing, by an adaptor, a power measurement to generate a value corresponding to the power consumption of the solid-state drive;
instructions for sampling, by at least one analog-to-digital converter (ADC) of the adaptor, the value to generate a digital value; and
instructions for transmitting, using a wireless transceiver of the adaptor, the digital value to a recording unit,
wherein a first end of the adaptor is coupled to the solid-state drive and a second end of the adaptor is coupled to the server backplane,
wherein the at least one ADC is configured to operate using a first bit-width and a first dynamic range, and
wherein the wireless transceiver, communicatively coupled to an antenna, is configured to operate using at least one wireless protocol.

19. The computer-readable storage medium of claim 18, wherein the first end of the adaptor is physically connected to the solid-state drive and the second end of the adaptor is physically connected to the server backplane.

20. The computer-readable storage medium of claim 18, wherein the wireless transceiver is coupled to an antenna, and wherein the antenna is (a) located within the server chassis or (b) located outside the server chassis and is connected to the adaptor via a cable.

* * * * *